(12) United States Patent
Wiant et al.

(10) Patent No.: US 10,498,112 B1
(45) Date of Patent: Dec. 3, 2019

(54) BUS BRACE ASSEMBLIES AND METHODS FOR POWER DISTRIBUTION SYSTEMS

(71) Applicant: Siemens Industry, Inc., Alpharetta, GA (US)

(72) Inventors: Jason P. Wiant, Bedford, TX (US); Donald Carey Boston, Arlington, TX (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 0 days.

(21) Appl. No.: 16/053,859

(22) Filed: Aug. 3, 2018

(51) Int. Cl.
*H02B 1/21* (2006.01)
*H05K 7/14* (2006.01)
*H01R 25/16* (2006.01)
*H02G 5/02* (2006.01)
*H02G 5/00* (2006.01)
*H02B 1/32* (2006.01)

(52) U.S. Cl.
CPC ............ *H02B 1/21* (2013.01); *H01R 25/162* (2013.01); *H02B 1/32* (2013.01); *H02G 5/007* (2013.01); *H02G 5/025* (2013.01); *H05K 7/1492* (2013.01)

(58) Field of Classification Search
CPC .......... H02B 1/21; H02B 1/32; H01R 25/162; H02G 5/007; H02G 5/025; H05K 7/1492
USPC .............. 361/611, 624, 637–639; 174/99 B, 174/149 B, 68.2
See application file for complete search history.

(56) References Cited

U.S. PATENT DOCUMENTS

| | | | |
|---|---|---|---|
| 3,924,161 A | 12/1975 | Olashaw et al. | |
| 4,360,857 A | 11/1982 | Olashaw | |
| 4,740,864 A | 4/1988 | Stanfield et al. | |
| 5,183,971 A * | 2/1993 | Lafosse .................... | H02B 1/21 174/129 B |
| 5,828,006 A * | 10/1998 | Graham .................... | H02G 5/06 174/99 R |
| 5,905,631 A * | 5/1999 | Winkler .................... | H02B 1/21 211/162 |
| 5,949,641 A * | 9/1999 | Walker ..................... | H02B 1/308 174/70 B |
| 6,040,976 A | 3/2000 | Bruner et al. | |
| 6,111,745 A | 8/2000 | Wilkie, II et al. | |
| 6,141,206 A | 10/2000 | Bruner et al. | |
| 6,169,248 B1 | 1/2001 | Rowe et al. | |
| 6,435,888 B1 | 8/2002 | Reed, Jr. | |
| 6,603,075 B1 | 8/2003 | Soares et al. | |
| 6,664,478 B2 * | 12/2003 | Mohan ..................... | H02G 5/025 174/149 B |
| 6,781,818 B2 * | 8/2004 | Josten ....................... | H02B 1/21 174/149 B |
| 6,878,891 B1 | 4/2005 | Josten et al. | |
| 6,888,066 B1 | 5/2005 | Wiant et al. | |
| 7,334,315 B2 | 2/2008 | Wiant et al. | |
| 7,449,635 B2 | 11/2008 | Wiant | |

(Continued)

*Primary Examiner* — Zachary Pape

(57) ABSTRACT

A power distribution system includes a bus support. The bus support includes a first sheet of non-conductive material including a first member and three or more second members extending from the first member and a second sheet of non-conductive material including a third member and three or more fourth members extending from the third member. Portions of the three or more second members overlap portions of the three or more fourth members to form two or more first openings. The two or more first openings are configured to receive one or more bus bars. Other embodiments and methods are disclosed.

19 Claims, 7 Drawing Sheets

(56) References Cited

U.S. PATENT DOCUMENTS

| | | | |
|---|---|---|---|
| 8,420,934 B2* | 4/2013 | Zhang | H02G 5/025 174/50 |
| 8,437,118 B2 | 5/2013 | Kasza et al. | |
| 8,662,604 B2 | 3/2014 | Rajvanshi et al. | |
| 8,717,741 B2 | 5/2014 | Valenzuela | |
| 8,921,701 B2* | 12/2014 | Lejawka | H02G 5/025 174/163 R |
| 9,144,161 B2 | 9/2015 | Kozuru et al. | |
| 9,391,413 B2 | 7/2016 | Blasbalg et al. | |
| 9,608,413 B2 | 3/2017 | Kubota et al. | |
| 9,622,374 B2 | 4/2017 | Bhattacharya et al. | |
| 9,705,294 B2 | 7/2017 | Kubota et al. | |
| 2010/0051342 A1 | 3/2010 | Diaz | |

\* cited by examiner

BUS BRACE ASSEMBLIES AND METHODS FOR POWER DISTRIBUTION SYSTEMS

FIELD

The present disclosure relates to assemblies, systems, and methods for electrical power distribution, and more specifically to bus brace assemblies.

BACKGROUND

In power distribution systems (e.g., switchgear and switchboard systems), moving the components as close together as possible minimizes the overall space envelope of the power distribution system and enables improved user accessibility. Such proximity of various buses, such as channel bus bars, to each other and to other devices can result in movement and bending of various components due to large electromagnetic forces present during high current events (e.g., short circuit events). If such movement and bending are sufficiently large, it is possible to have phase-to-phase contact and arcing between channel bus bars and other components within the power distribution systems. Movement and bending may also be caused by seismic events as well as during transportation and installation of the power distribution systems.

Bracing of channel bus bars may be used to help prevent such movement and bending. However, bracing takes up space within the power distribution systems and may limit the number of user controls, such as circuit breakers, that can fit within the power distribution system. Moreover, bracing may actually create magnetic loops within the power distribution system as well as make it difficult to meet industry standards for thru air and over surface distance requirements.

Thus, there is a need for bus brace assemblies that provide sufficient support to help withstand movement and bending within compact power distribution systems.

SUMMARY

According to a first aspect, a power distribution system is provided. The power distribution system includes a first bus support including a first sheet of non-conductive material including a first member and three or more second members extending from the first member and a second sheet of non-conductive material including a third member and three or more fourth members extending from the third member, wherein portions of the three or more second members overlap portions of the three or more fourth members to form two or more first openings, and wherein the two or more first openings are configured to receive one or more bus bars.

According to yet another aspect, a power distribution system is provided. The power distribution system may include a bus support including a first sheet of non-conductive material including a first member and two or more second members extending from the first member; a second sheet of non-conductive material including a third member and two or more fourth members extending from the third member, wherein portions of the two or more second members overlap portions of the two or more fourth members to form one or more first openings, wherein the one or more first openings are configured to receive one or more bus bars; and a tab extending into one or more of the first openings, the tab configured to be received in a recess in the one or more bus bars. The power distribution system may further include a post, a first support channel coupled between a first side of the bus support and the post, and a second support channel coupled between a second side of the bus support and the post, the second side opposite the first side.

According to yet another aspect, a method of making a power distribution system is provided. The method includes providing a first sheet of non-conductive material including a first member and three or more second members extending from the first member, providing a second sheet of non-conductive material including a third member and three or more fourth members extending from the third member, locating the first sheet within a frame of the power distribution system; receiving a bus bar between the second members of the first sheet, and positioning the second sheet into the frame, wherein the one or more bus bars are between the fourth members of the second sheet and wherein at least a portion the three or more second members of the second sheet overlap at least a portion of three or more fourth members of first sheet.

Still, other aspects, features, and advantages of the present disclosure may be readily apparent from the following description by illustrating a number of example embodiments, including the best mode contemplated for carrying out the present disclosure. The present disclosure may also be capable of other and different embodiments, and its details may be modified in various respects, all without departing from the substance and scope of the present disclosure. The disclosure covers all modifications, equivalents, and alternatives falling within the substance and scope of the claims.

BRIEF DESCRIPTION OF DRAWINGS

The drawings, described below, are for illustrative purposes only and are not necessarily drawn to scale. The drawings are not intended to limit the scope of the disclosure in any way. Wherever possible, the same or like reference numbers will be used throughout the drawings to refer to the same or like parts.

DETAILED DESCRIPTION

Figure 1:
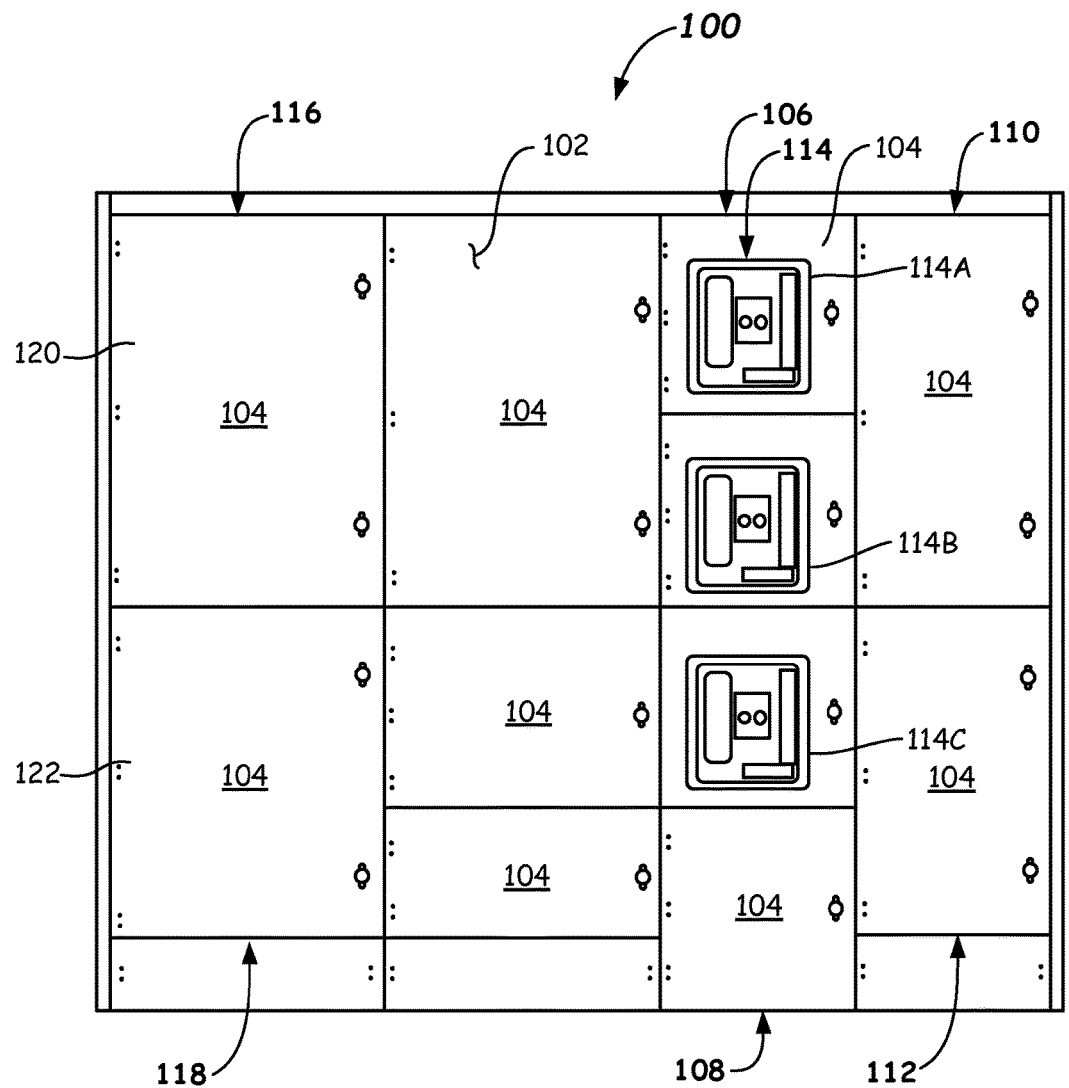
FIG. 1 illustrates a front elevation view of an exterior of a power distribution system according to one or more embodiments.

Reference will now be made in detail to the example embodiments of this disclosure, which are illustrated in the accompanying drawings. The use of horizontal and vertical orientations is for description purposes and is not meant to limit the scope of the disclosure. Power distribution systems, including switchgears and switchboards, may distribute electric power to a plurality of different systems, locations, and devices. For example, an input to a power distribution system may be from a main power line, such as the main power line to a building. The power distribution systems may have circuits and the like that distribute power to a plurality of locations, such as different floors or areas in a building or to different pieces of heavy equipment. Power distribution systems may have continuous current ratings ranging from 800 A to 6 kA and short circuit ratings ranging from 50 kA to 200 kA over a defined time interval. In some embodiments, the power distribution systems may monitor current flow to the different locations and may include circuit breakers to disconnect power to locations that draw current greater than a predetermined amperage.

Power distribution systems may be fabricated in panelized structures that may include a plurality of cabinets or cabinet sections. A plurality of connected cabinets may be referred to as a lineup. The front of the panel structures may include user controls, such as circuit breakers and/or monitoring devices. The interior of the power distribution systems may be densely packed with controls, buses, circuit breakers, and other components. Channel buses and their interconnections that distribute power to different locations may be accessible to users by way of panel structures located in the front of the power distribution system.

In some embodiments, each cabinet section of a power distribution system may include a vertical bus that supplies current originating from a horizontal branch bus to breakers within that cabinet section. The vertical bus may include a plurality of vertical bus bars that may be supplied with current by horizontal channel bus bars that run through the lineup of cabinet sections. A power distribution system may include an individual horizontally-extending bus bar for each electrical phase of a multiple phase system. For example, a three-phase power distribution system may include three horizontally-extending bus bars, one for each of the three power phases, and may include as a neutral conductor as well.

The vertical and horizontal bus bars within a power distribution system may be braced and/or supported to withstand electromagnetic forces created by high currents that flow through the power distribution system during high current events. As an example, the high currents flowing in bus bars as a result of short circuit events may create high electromagnetic forces strong enough to move or bend bus bars unless they are properly braced. Bracing may also protect the bus bars from seismic events as well as damage that may occur during transportation and installation of the power distribution systems.

Power distribution systems are disclosed herein that include channel bus brace assemblies that support electrical bus bars. The channel bus brace assemblies prevent movement of the bus bars when forces are applied to the bus bars. These forces may include electromagnetic forces created during high current events, such as during short circuit events, and forces during seismic events, for example. The channel brace assemblies may be mounted in a cantilevered configuration within a front-connected frame of a power distribution system. Bus bars supported by the channel bus brace assemblies may be vertically stacked such as to support a first bus bar for an A-phase at a top location, a second bus bar for a B-phase at a middle location, and a third bus bar for a C-phase at a bottom location, for example. The channel bus brace assemblies may reduce the probability of magnetic loops that may be created by additional bracing and ensure that standards for thru air and over surfaces distances are met.

Reference is now made to FIG. 1, which illustrates a front view of an embodiment of a power distribution system 100. The power distribution system 100 may be a switchgear or a switchboard, for example. The power distribution system 100 may include a front surface 102 including a plurality of panels 104 (a few labeled). A first plurality of panels 106 may include user interfaces 114, which may include controls, such as circuit breakers and/or other controllers to control and/or monitor power distribution to different locations. The power distribution system 100 depicted in FIG. 1 includes three user interfaces, referred to individually as a first user interface 114A, a second user interface 114B, and a third user interface 114C. The components within the first plurality of panels 106 may be collectively referred to as the circuit breaker section 108 and may electrically couple to the user interfaces 114. In the embodiment depicted in FIG. 1, the first plurality of panels 106 of the circuit breaker section 108 may be vertically aligned and stacked.

A second plurality of panels 110 may cover terminal assemblies, bus assemblies, cables, and the like that may electrically connect the power distribution system 100 to locations where power is distributed, such as locations in a building and power equipment, for example. These panels are collectively referred to as the cable pull section 112. In the embodiment depicted in FIG. 1, the second plurality of panels 110 of the cable pull section 112 may be vertically aligned and stacked.

A third plurality of panels 116 may cover horizontally-extending channel buses, vertically-oriented bus bars, horizontal branch buses, splice joints, and channel bus brace assemblies (not shown in FIG. 1). These panels are collectively referred to as the incoming section 118. In the embodiment depicted in FIG. 1, the third plurality of panels 116 of the incoming section 118 may be vertically aligned and stacked.

Reference is now made to panels 120 and 122 in the incoming section 118, which may be representative of other panels in their respective sections. The panels 120, 122 may be capable of being opened or removed to enable user access within the incoming section 118. Channel bus brace assemblies (not shown in FIG. 1) located behind the panels 120, 122 may be physically mounted to support channel buses, branch buses, and splice joints as described herein. Thus, a user may access channel bus brace assemblies as well as supported channel buses, branch buses, and splice joints, for example, from the front of the power distribution system 100.

Figure 2:
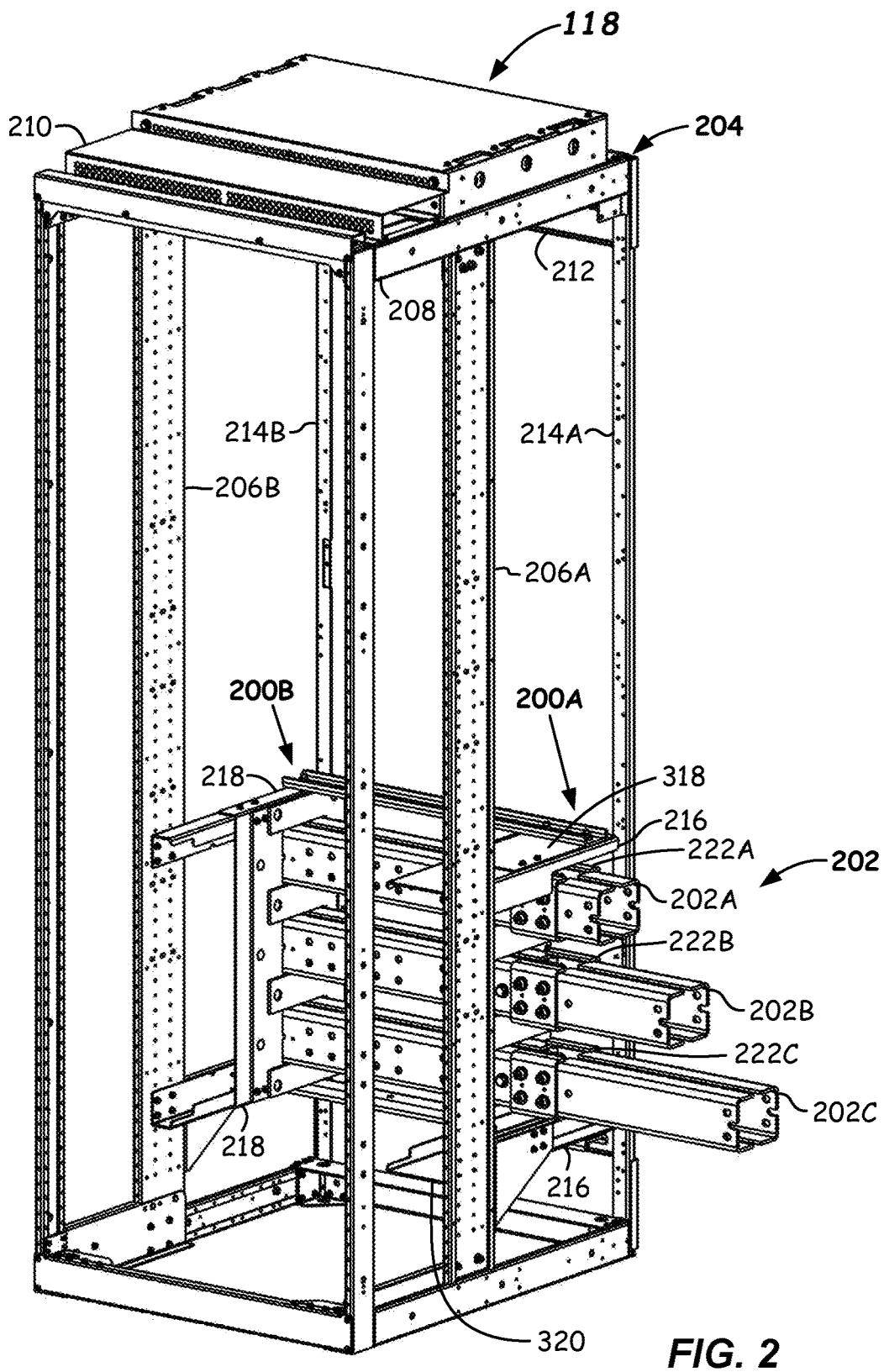
FIG. 2 illustrates an isometric view of a portion of an incoming section of a power distribution system including channel bus brace assemblies according to one or more embodiments.

Reference is now made to FIG. 2, which illustrates an isometric view of a portion of a section of the power distribution system 100, such as the incoming section 118. The incoming section 118 may include a first channel bus brace assembly 200A and a second channel bus brace assembly 200B that both support a horizontally-extending channel bus 202, which may be referred to herein as the "channel bus 202." Although shown in the incoming section 118, channel bus brace assemblies 200A, 200B may be located in sections of the power distribution system 100 other than the incoming section 118.

The channel bus 202 may include a first bus bar 202A, a second bus bar 202B, and a third bus bar 202C. In some embodiments, the bus bars 202A-202C extends horizontally. In some embodiments the bus bars 202A-202C are dual channel conductors, meaning that they each include two conductors, such as two C-shaped channels, which may be provided in a generally opposed orientation. The power distribution system 100 (FIG. 1) may distribute three-phase power (e.g., line power) by way of the bus bars 202A-202C.

Specifically, the power distribution system 100 (FIG. 1) may distribute an A-phase on the first bus bar 202A, a B-phase on the second bus bar 202B, and a C-phase on the third bus bar 202C. The power may be distributed throughout the power distribution system 100 (FIG. 1) by way of the channel bus 202. For example, the bus bars 202A-202C may provide three-phase power (e.g., A-phase, B-phase, and C-phase voltages) to and/or from the incoming section 118 (FIG. 1), which may be coupled to the provided to the circuit breaker section 108 (FIG. 1). Power then may be subsequently distributed to the cable pull section 112 (FIG. 1) or any other sections within the power distribution system 100 (FIG. 1). Channel buses similar or identical to the channel bus 202 may distribute the power throughout the power distribution system 100. Other embodiments may include fewer or more channel buses and sections within the power distribution system 100 (FIG. 1).

The first channel bus brace assembly 200A and the second channel bus brace assembly 200B may each brace and/or support the bus bars 202A-202C along the lengths thereof. For example, the first channel bus brace assembly 200A and the second channel bus brace assembly 200B may each receive and support the first bus bar 202A for an A-phase, the second bus bar 202B for a B-phase, and the third bus bar 202C for a C-phase. In some embodiments, the first channel bus brace assembly 200A and the second channel bus brace assembly 200B may receive bus bars conducting power to loads.

The first channel bus brace assembly 200A may be mounted to a first post 206A (e.g., a center post) within a frame 204, wherein the first post 206 may be attached to a first side 208 of the frame 204. The second channel bus brace assembly 200B may be mounted to a second post 206B (e.g., a center post) within the frame 204, wherein the second post 206B may be attached to a second side 210 of the frame 204. The first side 208 of the frame 204 may be opposite facing and parallel to the second side 210. A third side 212 (e.g., a back side) of the frame 204 may be in-between and substantially perpendicular to the first side 208 and the second side 210 of the frame 204.

The first channel bus brace assembly 200A may be mounted using a first cantilever 216 coupled to the first post 206A. The second channel bus brace assembly 200B may be mounted using a second cantilever 218 coupled to the second post 206B. The first and second cantilevers 216 and 218 may support the first channel bus brace assembly 200A and the second channel bus brace assembly 200B proximate the third side 212 and thereby reduce the depth of the frame 204. The cantilever configuration may also reduce the hardware supporting the first channel bus brace assembly 200A and the second channel bus brace assembly 200B. The configuration may provide a space between the first channel bus brace assembly 200A and the first post 206A. The configuration may also provide a space between the second channel bus brace assembly 200B and the second post 206B.

The first channel bus brace assembly 200A may also be coupled to a third post 214A (e.g., a rear post) that may be attached to the third side 212 of the frame 204, in a non-cantilevered configuration. Similarly, the second channel bus brace assembly 200B may be coupled to a fourth post 214B (e.g., a rear post) that may be attached to the third side 212 of the frame 204, in a non-cantilevered configuration.

Figure 3:
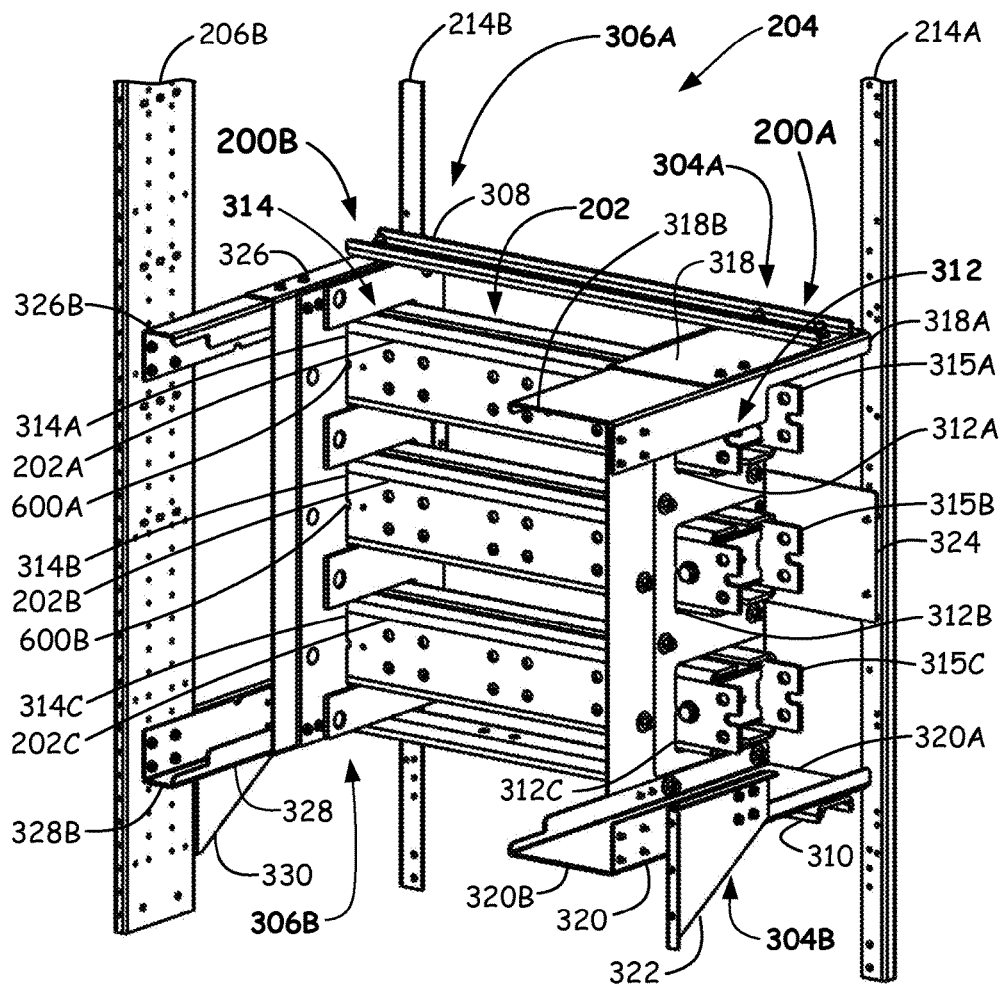
FIG. 3 illustrates a front isometric view of channel bus brace assemblies included in a power distribution system according to one or more embodiments.

Reference is now made to FIG. 3, which illustrates a front isometric view of the first channel bus brace assembly 200A and the second channel bus brace assembly 200B of the power distribution system 100 (FIG. 1) according to one or more embodiments. The first post 206A is not shown in FIG. 3 for illustration purposes.

The first channel bus brace assembly 200A may include a top side 304A and a bottom side 304B that is opposite the top side 304A. The use of top and bottom sides are for reference purposes only and are not limiting to the disclosure. The second channel bus brace assembly 200B may include a top side 306A and a bottom side 306B that is opposite the top side 306A. The top side 304A of the first channel bus brace assembly 200A and the top side 306A of the second channel bus brace assembly 200B may be coupled (e.g., bolted) to an first connector 308. Similarly, the bottom side 304B of the first channel bus brace assembly 200A and the bottom side 306B of the second channel bus brace assembly 200B may be coupled to a second connector 310. The first connector 308 and the second connector 310 may be coupled to the first channel bus brace assembly 200A and the second channel bus brace assembly 200B to reduce horizontal sway. The first connector 308 and the second connector 310 may be elongated bars of equal length formed from a rigid, non-conductive material.

The first channel bus brace assembly 200A may include one or more first openings 312 that may support and/or brace the bus bars 202A-202C. The first openings 312 may include a top opening 312A, a middle opening 312B, and a bottom opening 312C. In some embodiments, the first openings 312 may be vertically aligned and stacked. However, other alignments of the first openings 312, such as horizontal alignments, may be implemented while remaining within the scope of the embodiments.

Similarly, the second channel bus brace assembly 200B may include one or more second openings 314 that may support and/or brace the bus bars 202A-202C. The second openings 314 may include a top opening 314A, a middle opening 314B, and a bottom opening 314C. In some embodiments, the second openings 314 may be vertically aligned. However, other alignments of the second openings 314, such as a horizontal alignment, may be implemented while remaining within the scope of the embodiments.

Individual openings 312A-312C of first openings 312 in the first channel bus brace assembly 200A may be horizontally aligned with corresponding individual openings 314A-314C of the second openings 314 in the second channel bus brace assembly 200B. The horizontal alignment between the individual openings 312A-312B and the individual openings 314A-314C may support the bus bars 202A-202C. In the embodiment depicted in FIG. 3, the top openings 312A and 314A may support the first bus bar 202A. The middle openings 312B and 314B may support the second bus bar 202B. Lastly, the bottom openings 312C and 314C may support the third bus bar 202C.

The first channel bus brace assembly 200A may include a first support channel 318, a second support channel 320, a first gusset 322, and a first mounting bracket 324. The first support channel 318 may include a first end 318A and a second end 318B that is longitudinally opposite the first end 318A. The first end 318A may be coupled to the top side 304A of the first channel bus brace assembly 200A and may extend substantially perpendicular to the first connector 308. Substantially perpendicular may mean within 20° of perpendicular and substantially parallel may mean within 20° of parallel. The second end 318B may be coupled to the first post 206A (FIG. 2) within the frame 204.

The second support channel 320 may include a first end 320A and a second end 320B that is longitudinally opposite the first end 320A. The first end 320A may be coupled to the bottom side 304B of the first channel bus brace assembly 200A and may extend substantially perpendicular to the second connector 310. The second end 320B may be coupled to the first post 206A (FIG. 2) within the frame 204.

Referring again to FIG. 2, the first support channel 318 and the second support channel 320 may each be sized and positioned to provide for installation and access to one or more splice joints 222A-222C. The splice joints 222A-222C may electrically and/or mechanically couple sections of the bus bars 202A-202C together as shown in FIG. 2. In other embodiments, the splice joints 222A-222C may join the bus bars 202A-202C to other conductors. The bus bars 202A-202C may have ends 315A-315C (FIG. 3) that receive at least portions of splice joints 222A-222C that couple the ends 315A-315C to other conductors. In some embodiments, the splice joints 222A-222C may couple the ends 315A-315C to individual conductors in a horizontal branch bus (not shown).

Referring to FIG. 3, the first gusset 322 may be substantially triangular-shaped and may be coupled between the second support channel 320 and the first post 206A (FIG. 2) in the frame 204. The term, "substantially triangular-shaped" includes shapes having three sides wherein lines parallel to the three sides intersect. The first gusset 322 may have other shapes. The first mounting bracket 324 may extend substantially parallel to the first connector 308 and/or the second connector 310 and may be coupled between the first channel bus brace assembly 200A and the third post 214A.

Figure 5:
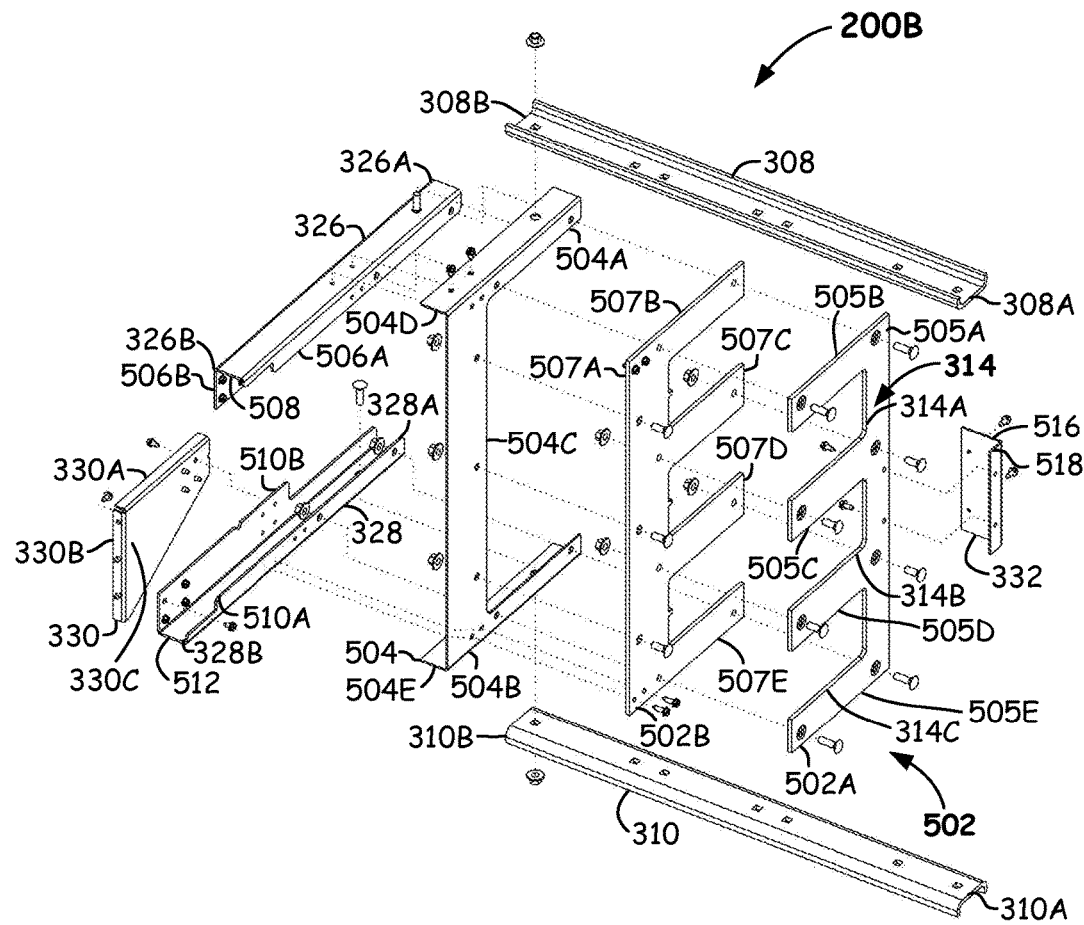
FIG. 5 illustrates an exploded view of a second channel bus brace assembly according to one or more embodiments.

The second channel bus brace assembly 200B may include an third support channel 326, a fourth support channel 328, a second gusset 330 and a second mounting bracket 332 (FIG. 5). The third support channel 326 may include a first end 326A (FIG. 5) and a second end 326B that is longitudinally opposite the first end 326A. The first end 326A may be coupled to the top side 306A of the second channel bus brace assembly 200B and may extend perpendicular to the first connector 308. The second end 326B may be coupled to the second post 206B within the frame 204.

The fourth support channel 328 may include a first end 328A (FIG. 5) and a second end 328B that is longitudinally opposite the first end 328A. The first end 328A may be coupled to the bottom side 306B of the second channel bus brace assembly 200B and may extend substantially perpendicular to the second connector 310. The second end 328B may be coupled to the second post 206B within the frame 204. The fourth support channel 328 may extend perpendicular to the second connector 310.

The second gusset 330 may be substantially triangular shaped and may be coupled between the fourth support channel 328 and the second post 206B within the frame 204. The second gusset 330 may have other shapes. The second mounting bracket 332 may extend substantially parallel to the first connector 308 and/or the second connector 310 and may be coupled between the second channel bus brace assembly 200B and the fourth post 214B.

Figure 4:
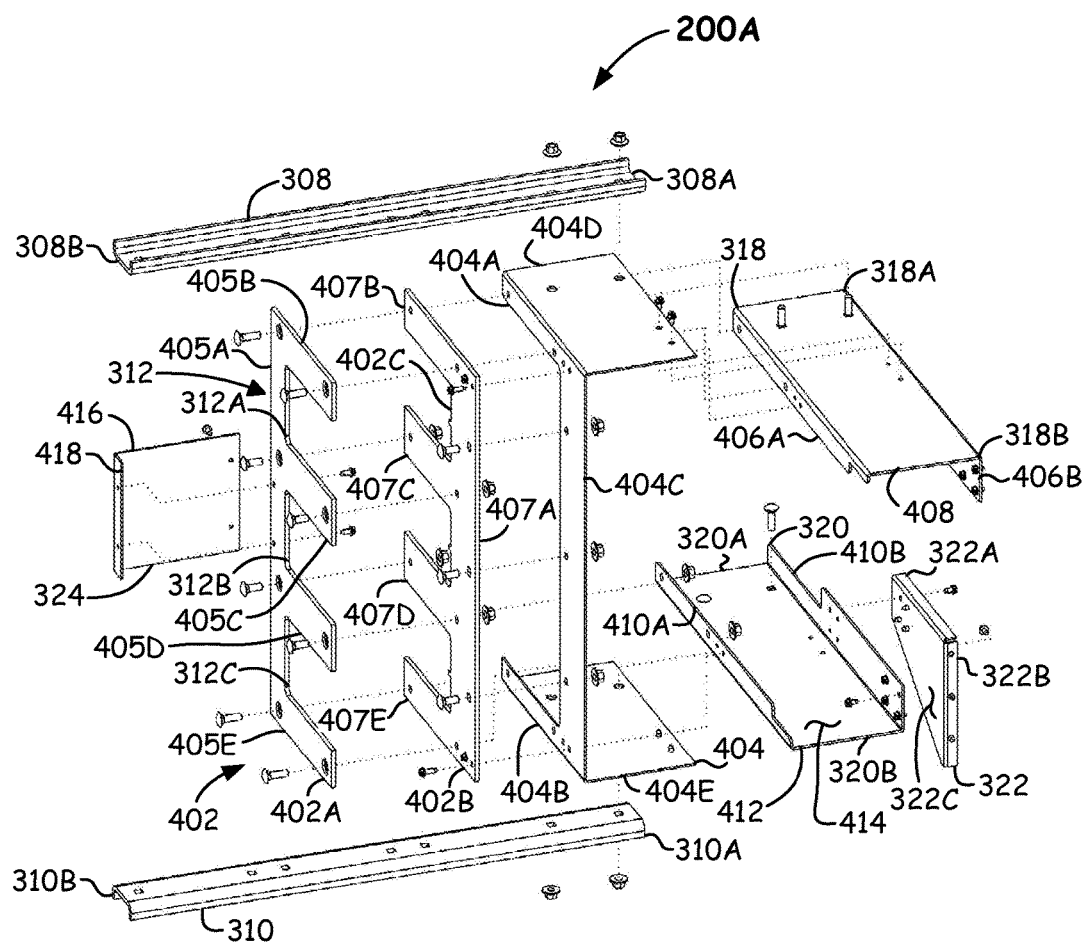
FIG. 4 illustrates an exploded view of a first channel bus brace assembly according to one or more embodiments.

Reference is now made to FIG. 4, which illustrates an exploded view of the first channel bus brace assembly 200A according to one or more embodiments. The first channel bus brace assembly 200A may include a first bus support 402 that may define the one or more first openings 312. The first bus support 402 may be formed from a plurality of overlapping sheets of a non-conductive material such as, for example, FR-4, a composite material composed of woven fiberglass cloth with an epoxy resin binder.

In the configuration shown in FIG. 4, the first bus support 402 may be formed from a first sheet 402A that may at least partially overlap a second sheet 402B. The first sheet 402A may be comb-shaped and the second sheet 402B may be comb-shaped and opposite facing relative to the first sheet 402A. For example, the first sheet 402A may include a first member 405A. A second member 405B, a third member 405C, a fourth member 405D, and a fifth member 405E may extend from the first member 405A. For example, the members 405B-405E may extend substantially perpendicular to the first member 405A. The members 405B-405E may be referred to collectively as the second members. The second sheet 402B may include a first member 407A. A second member 407B, a third member 407C, a fourth member 407D, and a fifth member 407E may extend substantially perpendicular from the first member 407A. The members 407B-407E may be referred to collectively as the second members.

The combination of the first sheet 402A and the second sheet 402B may define the first openings 312. As described above, the first openings may be vertically aligned and may include the top opening 312A, the middle opening 312B, and the bottom opening 312C. The first openings 312 may be formed by the members 405B-405E of the first sheet 402A at least partially overlapping the members 407B-407E of the second sheet 402B.

The shape of the first sheet 402A and second sheet 402B may be shaped to define a specific alignment configuration for the first openings 312 that support the bus bars 202A-202C (FIG. 3). The spacing between each of first openings 312 may be located at predetermined distances from each other. The predetermined distances may be great enough to meet thru air and over surface industry standards between the bus bars 202A-202C (FIG. 3). The shape of the one or more of the first openings 312 as formed by the combination of the first sheet 402A and the second sheet 402B may be the same or substantially similar to the cross-sectional shape of the bus bars 202A-202C. This shape of the first openings 312 enables the bus bars 202A-202C to fit snug within the first openings 312. The non-conductive material comprising the first bus support 402 in-between the bus bars 202A-202C may help minimize magnetic loops that may form between the bus bars 202A-202C. For example, the members 405B-405E and the members 407B-407E may minimize the magnetic loops.

The first bus support 402 may be coupled to a support structure 404. The support structure 404 may be C-shaped or substantially C-shaped and may include an upper portion 404A and a lower portion 404B that extend from opposite ends of a connector member 404C. An upper plate 404D may extend substantially perpendicular from the upper portion 404A and a lower plate 404E may extend substantially perpendicular from the lower portion 404B. The C-shape of the support structure 404 may help minimize magnetic loops that may form between the bus bars 202A-202C (FIG. 3) supported by the first bus support 402.

The upper portion 404A, the lower portion 404B, and the connector member 404C may each be coupled to the perimeter of the first bus support 402. In the embodiment depicted in FIG. 4, the second members 405B and 407B may be coupled to the upper portion 404A. The fifth members 405E and 407E may be coupled to the lower portion 404B. The first members 405A and 407A may be coupled to the connector member 404C. The support structure 404 may be formed of a rigid material such as, for example, steel, to provide additional structural support to the first bus support 402. Some embodiments of the first channel bus brace assembly 200A may not include the support structure 404.

The first support channel 318 may be coupled to the upper plate 404D and/or the upper portion 404A. The second support channel 320 may be coupled to the lower plate 404E and/or the lower portion 404B. In some embodiments, the first support channel 318 and the second support channel 320 may each be coupled directly to the perimeter of the first bus support 402. For example, if the first channel bus brace assembly 200A does not include the support structure 404, the first support channel 318 and the second support channel 320 may each be coupled directly to the perimeter of the first bus support 402.

The first support channel 318 may include a first portion 406A and a second portion 406B that may be substantially parallel to the first portion 406A. A third portion 408 may be coupled to both the first portion 406A and the second portion 406B. The first portion 406A may be coupled to the upper portion 404A of the support structure 404. The third portion 408 may be coupled to the upper plate 404D of the support structure 404. In some embodiments, such as if the first channel bus brace assembly 200A does not include the support structure 404, the first portion 406A may be coupled directly to the perimeter of the first bus support 402.

The second support channel 320 may include a first portion 410A and a second portion 410B that may be substantially parallel to the first portion 410A. A third portion 412 may be coupled to both the first portion 410A and the second portion 410B. The first portion 410A may be coupled to the lower portion 404B of the support structure 404. The third portion 412 may be coupled to the lower plate 404E of the support structure 404. In some embodiments, such as if the first channel bus brace assembly 200A does not include the support structure 404, the first portion 410A may be coupled directly to the perimeter of the first bus support 402.

The third portion 412 may have a surface 414 that forms a space that may be as wide as the above-described splice joints 222A-222C (FIG. 2), or other types of conductors, coupled to the ends 315A-315C (FIG. 3) of the bus bars 202A-202C. The width of the surface 414 may provide space for the splice joints 222A-222C and may enable users to access the splice joints 222A-222C.

The first gusset 322 may be coupled to the second portion 410B of the second support channel 320. The first gusset 322 may include a first leg 322A, a second leg 322B that is substantially perpendicular to the first leg 322A, and a face 322C that extends between the first leg 322A and the second leg 322B. The face 322C may be coupled to the second portion 410B of the second support channel 320 proximate to the second end 320B. The first leg 322A may be substantially parallel to the second portion 410B and the second leg 322B may be coupled to the first post 206A (FIG. 2).

The first connector 308 may be coupled at a first end 308A to the upper plate 404D of the support structure 404. The second connector 310 may be coupled at a second end 310A to the lower plate 404E of the support structure 404. Alternatively, the first connector 308 may be coupled directly to the first support channel 318 and the second connector 310 may be coupled directly to the second support channel 320.

The first support channel 318, the second support channel 320, and the first gusset 322 may combine to form a first cantilever 216 (FIG. 2). A first end of the first cantilever 216 (FIG. 2) may be coupled to the perimeter of the first bus support 402 and a second end of the first cantilever 216 may be coupled to the first post 206A (FIG. 2) within the frame 204.

The first mounting bracket 324 may include a first portion 416 and a second portion 418 that is substantially perpendicular to the first portion 416. The second portion 418 may be coupled to the first bus support 402 such that the first portion 416 may be substantially parallel with the first connector 308 and/or the second connector 310. The first portion 416 may be coupled to the third post 214A (FIG. 2). The first mounting bracket 324 may not be load bearing, but rather may prevent the first channel bus brace assembly 200A from swaying or otherwise moving laterally.

Reference is now made to FIG. 5, which illustrates an exploded view of the second channel bus brace assembly 200B according to one or more embodiments. The second channel bus brace assembly 200B may include a second bus support 502 that defines the second openings 314. As with the first bus support 402 (FIG. 4), the second bus support 502 may be formed from a plurality of overlapping sheets of high strength and non-conductive material such as, for example, FR-4.

In the configuration shown in FIG. 5, the second bus support 502 may be formed from a first sheet 502A that may at least partially overlap a second sheet 502B. The first sheet 502A may be comb-shaped and the second sheet 502B may be comb-shaped and opposite facing relative to the first sheet 502A. The first sheet 502A may include a first member 505A. A second member 505B a third member 505C, a fourth member 505D, and a fifth member 505E may extend from the first member 505A. For example, the members 505B-505E may extend substantially perpendicular to the first member 505A. The second sheet 502B may include a first member 507A with a second member 507B, a third member 507C, a fourth member 507D, and a fifth member 507E extending substantially perpendicular from the first member 507A. The combination of the first sheet 502A and the second sheet 502B may define the second openings 314. For example, the members 505B-505E may overlap with the members 507B-507E to form the second openings 314. In some embodiments, the second openings 314 may be vertically aligned. As described above, the second openings 314 may include the top opening 314A, the middle opening 314B, and the bottom opening 314C.

The shape of the first sheet 502A and second sheet 502B may define a specific alignment configuration for the second openings 314 that receive the bus bars 202A-202C (FIG. 3). The spacing between each of the second openings 314 may meet thru air and over surface industry standards between the bus bars 202A-202C (FIG. 3). The shape of second openings 314 as formed by the combination of the first sheet 502A and the second sheet 502B may be the same or substantially similar to the cross-sectional shapes of the bus bars 202A-202C and or the first openings 312 (FIG. 4).

As described above with the first bus support 402 (FIG. 4) a non-conductive material comprising the second bus support 502 located in-between the bus bars 202A-202C may help minimize magnetic loops that may form between the bus bars 202A-202C. For example, the members 505B-505D and the members 507B-505D may minimize magnetic loops.

The second bus support 502 may be coupled to a support structure 504. The support structure 504 may be substantially C-shaped with an upper leg 504A and a lower leg 504B. The upper leg 504A and the lower leg 504B may extend from opposite ends of a connector member 504C. An upper lip 504D may extend substantially perpendicular from the upper leg 504A and a lower lip 504E may extend substantially perpendicularly from the lower leg 504B. The C-shape of the support structure 504 may minimize magnetic loops that may form between the bus bars 202A-202C (FIG. 3) supported by the second bus support 502.

The upper leg 504A, the lower leg 504B, and the connector member 504C may be coupled to the perimeter of the second bus support 502. The support structure 504 may be formed of a rigid material such as, for example, steel, to provide additional structural support to the second bus support 502. Some embodiments of the second channel bus brace assembly 200B may not include the support structure 504.

The third support channel 326 may be coupled to the upper lip 504D and the upper leg 504A. The fourth support channel 328 may be coupled to the lower lip 504E and the lower leg 504B. In some embodiments, the second channel bus brace assembly 200B may not include the support structure 504. In such embodiments, the third support channel 326 and the fourth support channel 328 may be coupled directly to the perimeter of the second bus support 502.

The third support channel 326 may include a first portion 506A and a second portion 506B that may be substantially parallel to the first portion 506A. A third portion 508 may be coupled to both the first portion 506A and the second portion 506B. The first portion 506A may be coupled to the upper leg 504A of the support structure 504. The third portion 508 may be coupled to the upper lip 504D of the support structure 504. In some embodiments, the second channel bus brace assembly 200B may not include the support structure 504. In such embodiments, the first portion 506A may be coupled directly to the perimeter of the second bus support 502.

The fourth support channel 328 may include a first portion 510A and a second portion 510B that may be substantially parallel to the first portion 510A. A third portion 512 may be coupled to both the first portion 510A and the second portion 510B. The first portion 510A may be coupled to the lower leg 504B of the support structure 504. The third portion 512 may be coupled to the lower lip 504E of the support structure 504. In some embodiments where the second channel bus brace assembly 200B may not include the support structure 504, the first portion 510A may be coupled directly to the perimeter of the second bus support 502.

The second gusset 330 may be coupled to the second portion 510B of the fourth support channel 328. The second gusset 330 may include a first lip 330A, a second lip 330B substantially perpendicular to the first lip 330A and a face 330C extending between the first lip 330A and the second lip 330B. The face 330C may be coupled to the second portion 510B of the fourth support channel 328 proximate the second end 328B. The second lip 330B may be substantially parallel to the second portion 510B and the second lip 330B may be coupled to the second post 206B (FIG. 2) within the frame 204 (FIG. 2).

The first connector 308 may be coupled at one end 308B to the upper lip 504D of the support structure 504. An end 310B of the second connector 310 at one end 310B may be coupled to the lower lip 504E of the support structure 504. In some embodiments where the second channel bus brace assembly 200B does not include the support structure 504, the first connector 308 may be coupled directly to the third support channel 326 and the second connector 310 may be coupled directly to the fourth support channel 328.

The third support channel 326, the fourth support channel 328, and the second gusset 330 may combine to form the second cantilever 218 (FIG. 2). One end of the second cantilever 218 (FIG. 2) may be coupled to the second bus support 502. The other end of the second cantilever 218 (FIG. 2) may be coupled to the second post 206B (FIG. 2).

The second mounting bracket 332 may be coupled to the second bus support 502. The second mounting bracket 332 may include a first portion 516 and a second portion 518 that is substantially perpendicular to the first portion 516. The second portion 518 may be coupled to the second bus support 502 such that the first portion 516 is substantially parallel with the first connector 308 and/or the second connector 310. The first portion 516 may be coupled to the fourth post 214B (FIG. 2).

Figure 6:
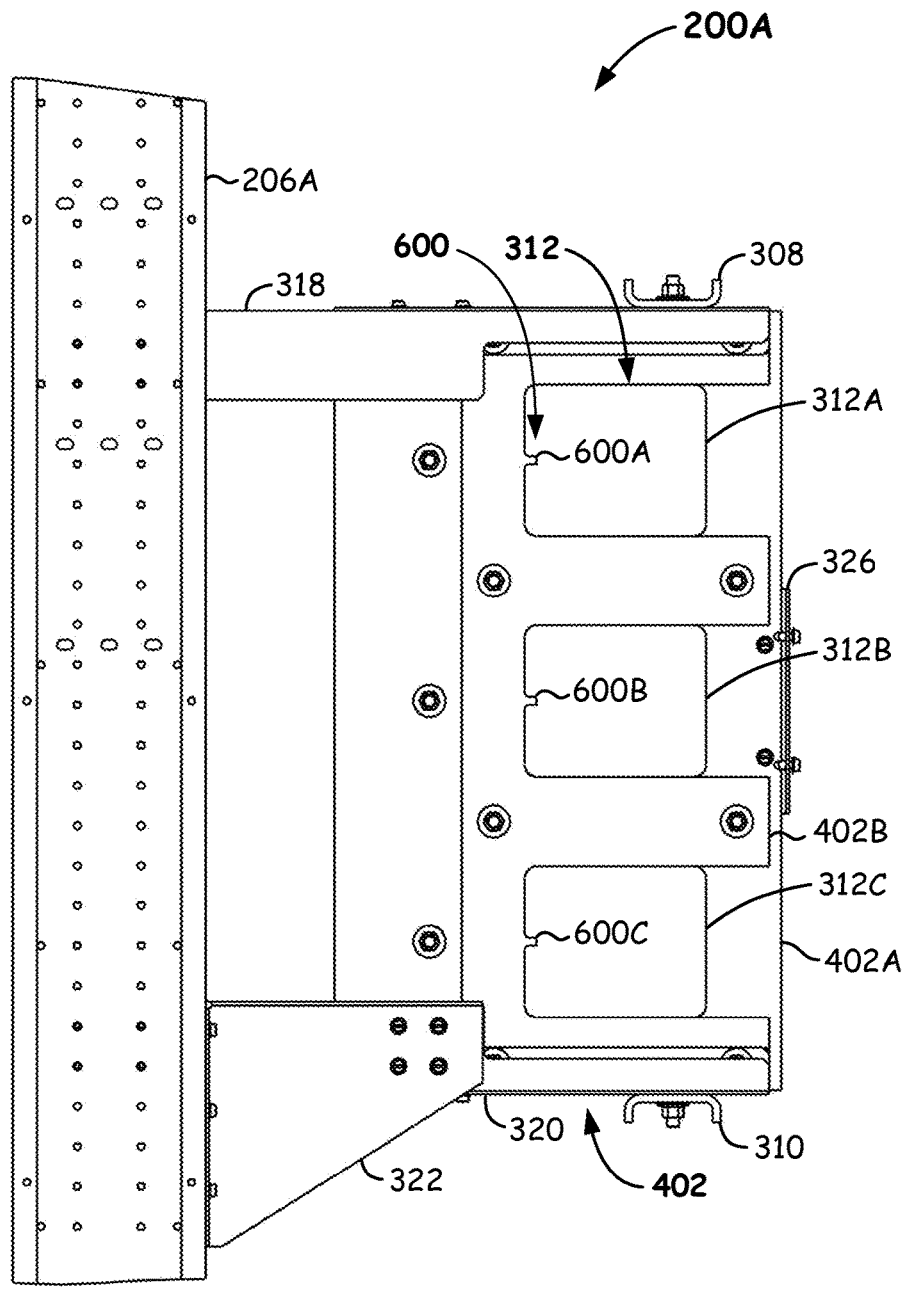
FIG. 6 illustrates a side elevation view of a channel bus brace assembly according to one or more embodiments.

Reference is now made to FIG. 6, which illustrates a side elevation view of the first channel bus brace assembly 200A according to one or more embodiments. The second channel bus brace assembly 200B may have the same elements as the first channel bus brace assembly 200A as shown in FIG. 6. The first channel bus brace assembly 200A may include tabs 600 (e.g., location tabs) positioned on a perimeter of one or more of the first openings 312. Similarly, the second channel bus brace assembly 200B (FIG. 5) may include tabs positioned on a perimeter of one or more of the second openings 314 (FIG. 5).

As shown in FIG. 6, the second sheet 402B of the first bus support 402 may include the tabs 600 on a perimeter of one or more of one or more of the first openings 312. For example, a top tab 600A may project into the top opening 312A, a middle tab 600B may project into the middle opening 312B, and a bottom tab 600C may project into the bottom opening 312C. The tabs 600 may be formed of the same material as the first bus support 402 and the second bus support 502, such as a high strength and non-conductive material such as, for example, FR-4. In some embodiments, the tabs 600 are integrally formed with the first bus support 402.

The tabs 600 may be configured to fit into recesses or holes (not shown) on the bus bars 202A-202C (FIG. 3) received within the first channel bus brace assembly 200A and/or within the second channel bus brace assembly 200B. The tabs 600 may minimize movement of the bus bars 202A-202C (FIG. 3) relative to the channel bus brace assemblies 200A and 200B.

As shown in FIG. 6, the first end 318A of the first support channel 318 and the first end 320A of the second support channel 320 may each be coupled to the first post 206A. The first gusset 322 may be similarly coupled to the first post 206A.

Fabricating the incoming section 118 (FIG. 2) or the power distribution system 100 (FIG. 1) may include fabricating the first channel bus brace assembly 200A and the second channel bus brace assembly 200B without the first sheet 402A (FIG. 4) and the first sheet 502A (FIG. 5). In such a configuration, the first openings 312 and the second openings 314 are similar to channels in that they are open rather than closed. The incoming section 118 and or the power distribution system 100 may be laid such that the channels of the first openings 312 and the second openings 314 face upward. The individual bus bars 202A-202C may be set into the first openings 312 and the second openings 314 via the channels. Recesses in the bus bars 202A-202C may receive the tabs 600 in one or more of the first openings 312 and/or one or more of the second openings 314. The second sheet 402B (FIG. 4) and the second sheet 502B may be placed into position against the first sheet 402A and the first sheet 502A, respectively. The members 405B-405E may overlap with the members 407B-407E to form the first openings 312, which secure the bus bars 202A-202C into the first channel bus brace assembly. Likewise, the members 505B-505E may overlap with the members 507B-507E to form the second openings 314, which secure the bus bars 202A-202C into the second channel bus brace assembly 200B. The first sheet 402A may be fastened to the second sheet 402B and the first sheet 502A may be fastened to the second sheet 502B. The incoming section 118 and/or the power distribution system 100 may then be placed in an upright position, such as shown in FIG. 2.

As shown in FIG. 4, the above-described embodiments show the first channel bus brace assembly 200A having a second support channel 320 with a surface 414 on a third portion 412 whose width may provide space for the splice joints 222A-222C (FIG. 2). Alternatively, the second channel bus brace assembly 200B may be configured to accommodate the splice joints 222A-222C (FIG. 2). Specifically, as shown in FIG. 5, the second channel bus brace assembly 200B may have a fourth support channel 328 with a surface (not shown) whose width may provide space for the splice joints 222A-222C (FIG. 2). In other words, the first channel bus brace assembly 200A, the second channel bus brace assembly 200B, or both may be configured to accommodate the splice joints 222A-222C (FIG. 2).

Figure 7:
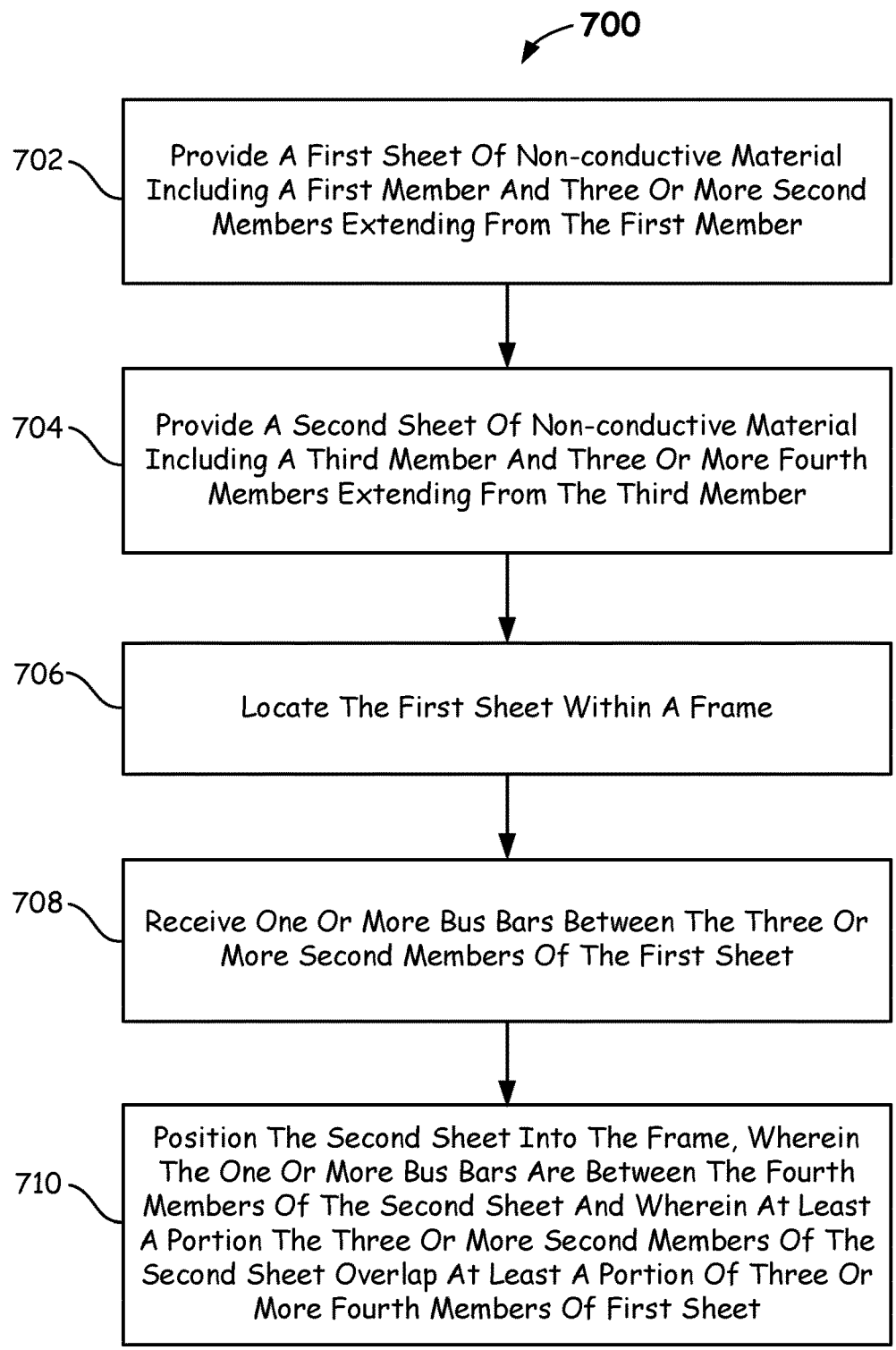
FIG. 7 illustrates a flowchart of a method of assembling a power distribution assembly according to one or more embodiments.

Reference is now made to FIG. 7, which illustrates a flowchart of a method 700 of making a power distribution assembly according to one or more embodiments. The method 700 may include, at 702, providing a first sheet (e.g., sheet 402B) of non-conductive material including a first member (e.g., first member 407A) and three or more second members (e.g., members 407B-407E) extending from the first member. The method 700 may include, at 704, providing a second sheet (e.g. sheet 402A) of non-conductive material including a third member (e.g., member 405A) and three or more fourth members (e.g., members 405B-405E) extending from the third member. The method may include, at 706, locating the first sheet within a frame (e.g., frame 204). The method may include, at 708, receiving one or more bus bars (e.g., one of the bus bars 202A-202B) between the three or more second members of the first sheet. The method may include, at 710, positioning the second sheet into the frame, wherein the one or more bus bars are between the fourth members of the second sheet and wherein at least a portion the three or more second members of the second sheet overlap at least a portion of three or more fourth members of first sheet.

It should be readily appreciated that the present disclosure is susceptible of broad utility and application. Many embodiments and adaptations of the present disclosure other than those herein described, as well as many variations, modifications, and equivalent arrangements, will be apparent from, or reasonably suggested by, the present disclosure and the foregoing description thereof, without departing from the substance or scope of the present disclosure. Accordingly, while the present disclosure has been described herein in detail in relation to specific embodiments, it is to be understood that this disclosure is only illustrative and presents examples of the present disclosure and is made merely for purposes of providing a full and enabling disclosure. This disclosure is not intended to be limited to the particular apparatus, assemblies, systems and/or methods disclosed, but, to the contrary, the intention is to cover all modifications, equivalents, and alternatives falling within the scope of the claims.

What is claimed is:

1. A power distribution system, comprising:
 a first bus support comprising:
  a first sheet of non-conductive material that is flat and includes a first member and three or more second members extending from the first member;
  a second sheet of non-conductive material including a third member and three or more fourth members extending from the third member,
  wherein portions of the three or more second members overlap portions of the three or more fourth members to form two or more first openings, and
  wherein the two or more first openings are configured to receive two or more bus bars; and
 a support structure, comprising:
  a connector member adjacent the first member of the second sheet;
  an upper leg extending from the connector member and adjacent a first of the three or more second members; and
  a lower leg extending from the connector member and adjacent a second of the three or more second members.

2. The power distribution system of claim 1, wherein one or more of the first openings comprise at least one tab extending therein, the at least one tab configured to be received into at least one recess in the one or more bus bars.

3. The power distribution system of claim 1, wherein the two or more first openings comprise a shape that is the same as a cross-sectional shape of the one or more bus bars.

4. The power distribution system of claim 1, wherein the two or more first openings are vertically aligned.

5. The power distribution system of claim 1, further comprising a second bus support comprising:
 a first sheet of non-conductive material including a first member and three or more second members extending from the first member; and
 a second sheet of non-conductive material including a third member and three or more fourth members extending from the third member;
 wherein portions of the three or more second members overlap portions of the three or more fourth members to form two or more second openings; and
 wherein the two or more second openings are configured to receive the one or more bus bars.

6. The power distribution system of claim 5, wherein one or more of the second openings of the second bus support have at least one tab extending therein, the at least one tab configured to project into at least one recess in the one or more bus bars.

7. The power distribution system of claim 5, further comprising a support structure comprising:
 a connector member adjacent the first member of the second sheet;
 an upper leg extending from the connector member and adjacent a first of the three or more second members; and
 a lower leg extending from the connector member and adjacent a second of the three or more second members.

8. The power distribution system of claim 5, further comprising:
 a second post;
 a third support channel coupled between a first side of the second bus support and the second post; and
 a fourth support channel coupled between a second side of the second bus support and the second post, the second side opposite the first side.

9. The power distribution system of claim 8, further comprising a second gusset coupled between the fourth support channel and the second post.

10. The power distribution system of claim 9, further comprising a space between the second post and the second bus support, wherein the third support channel, the fourth support channel, and the second gusset are configured as a second cantilever, the second cantilever coupling the second bus support to the second post.

11. The power distribution system of claim 5, wherein the two or more second openings of the second bus support are horizontally aligned with the two or more first openings of the first bus support.

12. The power distribution system of claim 5, further comprising:
   a first connector coupled between a first side of the first bus support and a first side of the second bus support; and
   a second connector coupled between a second side of the first bus support and a second side of the second bus support.

13. The power distribution system of claim 7, further comprising:
   a third post;
   a fourth post;
   a first mounting bracket coupled between the first bus support and the third post; and
   a second mounting bracket coupled between the second bus support and the fourth post.

14. A power distribution system, comprising:
   a first bus support comprising:
      a first sheet of non-conductive material that is flat and includes a first member and three or more second members extending from the first member, and
      a second sheet of non-conductive material including a third member and three or more fourth members extending from the third member,
      wherein portions of the three or more second members overlap portions of the three or more fourth members to form two or more first openings, and
      wherein the two or more first openings are configured to receive two or more bus bars;
   a first post;
   a first support channel coupled between a first side of the first bus support and the first post; and
   a second support channel coupled between a second side of the first bus support and the first post, the second side opposite the first side.

15. The power distribution system of claim 14, wherein the one or more bus bars has an end with a splice joint at least partially coupled thereto, wherein the splice joint has a width, and wherein the second support channel has a width about the same as the width of the splice joint.

16. The power distribution system of claim 14, further comprising a first gusset coupled between the second support channel and the first post.

17. The power distribution system of claim 16, further comprising a space between the first post and the first bus support, wherein the first support channel, the second support channel, and the first gusset are configured as a first cantilever, the first cantilever coupling the first bus support to the first post.

18. A power distribution system comprising:
   a bus support comprising:
      a first sheet of non-conductive material including a first member and two or more second members extending from the first member;
      a second sheet of non-conductive material including a third member and two or more fourth members extending from the third member, wherein portions of the two or more second members overlap portions of the two or more fourth members to form one or more first openings, wherein the one or more first openings are configured to receive one or more bus bars; and
      a tab extending into one or more of the first openings, the tab configured to be received in a recess in the one or more bus bars;
   a post;
   a first support channel coupled between a first side of the bus support and the post; and
   a second support channel coupled between a second side of the bus support and the post, the second side opposite the first side.

19. A power distribution system, comprising:
   a first bus support comprising:
      a first sheet of non-conductive material including a first member and three or more second members extending from the first member;
      a second sheet of non-conductive material including a third member and three or more fourth members extending from the third member;
   a first post;
   a first support channel coupled between a first side of the first bus support and the first post; and
   a second support channel coupled between a second side of the first bus support and the first post, the second side opposite the first side;
   wherein portions of the three or more second members overlap portions of the three or more fourth members to form two or more first openings; and
   wherein the two or more first openings are configured to receive two or more bus bars.

* * * * *